(12) United States Patent
Warren (10) Patent No.: US 7,694,264 B2
(45) Date of Patent: Apr. 6, 2010

(54) PULSE LINK AND APPARATUS FOR TRANSMITTING DATA AND TIMING INFORMATION ON A SINGLE LINE

(75) Inventor: Robert Geoffrey Warren, Bristol (GB)

(73) Assignee: STMicroelectroncis (Research & Development) Limited, Buckinghamshire (GB)

( * ) Notice: Subject to any disclaimer, the term of this patent is extended or adjusted under 35 U.S.C. 154(b) by 440 days.

(21) Appl. No.: 11/635,369

(22) Filed: Dec. 7, 2006

(65) Prior Publication Data
US 2007/0250802 A1 Oct. 25, 2007

(30) Foreign Application Priority Data
Dec. 16, 2005 (EP) .................................. 05257787

(51) Int. Cl.
*G06F 17/50* (2006.01)
(52) U.S. Cl. ................................. 716/14; 716/1; 716/18
(58) Field of Classification Search ..................... 716/1, 716/14, 18; 341/53; 326/47
See application file for complete search history.

(56) References Cited

U.S. PATENT DOCUMENTS

| 6,020,834 | A | | 2/2000 | Rider |
| 6,060,903 | A | * | 5/2000 | Rangasayee et al. .......... 326/39 |
| 6,205,182 | B1 | * | 3/2001 | Pardini et al. ................ 375/260 |
| 6,208,667 | B1 | | 3/2001 | Caldara et al. |
| 6,275,526 | B1 | | 8/2001 | Kim |
| 6,463,092 | B1 | | 10/2002 | Kim et al. |
| 6,914,597 | B2 | * | 7/2005 | Myers ......................... 345/204 |
| 7,181,557 | B1 | * | 2/2007 | Falik et al. ................... 710/110 |
| 7,336,627 | B1 | * | 2/2008 | Hasegawa et al. ........... 370/282 |
| 2001/0052695 | A1 | | 12/2001 | Stierle et al. |
| 2002/0178274 | A1 | * | 11/2002 | Kovacevic ................... 709/231 |

* cited by examiner

*Primary Examiner*—Sun J Lin (57) ABSTRACT

A routing block using a switch with a pulsed serial link. An input of a routing block is supplied with an information signal. The routing block has multiple outputs. The information signal includes a first edge and a second edge on a single line. The first and second edges are separated by a time period. One of the first and second edges represents information conveyed by the signal. The other one of the first and second edges provides timing information. The information signal controls the routing block to select one of the multiple outputs and the transferring the signal to said selected one of said multiple outputs. Depending on the number of bits of information transmitted in each pulse and the number of switches controlled by the control information, the decoded control data will include at least one bit outputted serially to a control signal generator block.

25 Claims, 9 Drawing Sheets

PULSE LINK AND APPARATUS FOR TRANSMITTING DATA AND TIMING INFORMATION ON A SINGLE LINE

CROSS-REFERENCE TO RELATED APPLICATIONS

The present application is related to European Patent Application No. 05257787.1, filed Dec. 16, 2005, entitled "SWITCH WITH A PULSED SERIAL LINK". European Patent Application No. 05257787.1 is assigned to the assignee of the present application and is hereby incorporated by reference into the present disclosure as if fully set forth herein. The present application hereby claims priority under 35 U.S.C. §119(a) to European Patent Application No. 05257787.1.

TECHNICAL FIELD

The present disclosure relates to a switch and a method of generally using a switch in the context of routing on-chip signals.

BACKGROUND

Conventional integrated circuits (ICs) use timing signals to control sequences of events across a chip, and this is known as synchronous design. A clock signal is sent to each module on a chip and data signals are sent on separate lines. If a first module sends data to a second module following a clock transition $T_n$, then the second module will capture the data at the next clock transition, $T_{n+1}$. The use of synchronous design is a crucial factor in constraining the complexity of problems in integrated circuit design.

A typical system on a chip (SoC) may have a large number of clocks. All of the logic in all of the modules clocked by a single clock, and all of the logic and data connections between such modules is known as a single clock environment and this conforms to synchronous design. Other design techniques are employed for data signals that cross between logic or modules that are clocked by different clocks.

Whilst synchronous design between modules generally limits IC design problems there are problems with this approach. Firstly, for a synchronous chip to function correctly, a reliable clock signal has to be available across every part of the design. Tracks are generally used to transport the clock signal on a chip. High drive strengths will be required in order to overcome capacitance on these tracks. Lines with high drive strengths risk being cross-talk aggressors, meaning that they interfere with other lines on the chip. The solution is generally to limit the maximum length of any one track, and use repeaters where the track length is longer than this maximum length. However, in order to distribute the clock, there may well not be one long thin track, but a tree branch fan-out to a number of destinations. Driving a lot of circuit track has a number of undesirable effects including inducing cross-talk and transistor lifetime degradation. Furthermore, there are often design problems in driving many buffers to all destinations on a chip.

The problems with synchronous designs may be partially overcome in asynchronous designs, in which modules on a chip may operate at their own independent speeds, and no clock signal is transmitted between modules. However, an entirely asynchronous design is an extremely difficult proposition in practice, due to the uncertainty of when signals in the circuit are valid.

An approach has been proposed which is globally asynchronous, locally synchronous (GALS). This means that the logic in each module on a chip is synchronous while the connections between modules are asynchronous. This approach promises to solve timing problems and reduce power consumption, all without designers needing to learn fundamentally new skills or abandoning any of the existing huge investment in predefined, synchronous IP (Intellectual Property) circuit blocks. However, for asynchronous communication between modules on a chip, there are two basic requirements: the receiving unit has to know when to read the data line; and the sending unit has to know when it can send a new value. In synchronous designs these issues are controlled by the system clock, and by knowing the timing characteristics of the link, timing can be controlled such that these requirements are met.

Asynchronous design is significantly more difficult both for manual analysis and to automate because of the computational complexity. In synchronous design, it is only the final, settled output of each logic cone that needs to be analysed in terms of its logic value and timing; that is, what is the longest path that a transition could take to propagate through the logic cone and also what is the shortest path (used to determine how long the result will remain stable after a subsequent clock). This synchronous design analysis only need be performed at two process extremes, the slowest PVT (process, voltage, temperature) for the longest path and the fastest PVT for the shortest path. In synchronous design, it does not matter if the output of any cone of logic changes any number of times or glitches prior to the final settled output time because the resultant data is only captured once coincident with the following clock edge. However, in asynchronous design multiple output changes and glitches need to be avoided and the analysis for such needs to be performed across all variations of input timings and all combinations of timing paths through the logic cone.

In asynchronous design, the simplest approach is to use two wires—one for '1's and the other for '0's. When both wires are low, then no data is transmitted and the receiver knows that there is no data value on the wire. When either wire is set to high, the receiver knows that there is data on the wire, and depending on which wire is set to high, the data will be a 0 or a 1. Another approach is to have one wire designated as a clock or strobe, and the second wire (or collection of wires) carrying the data.

Particular problems arise when switching multi-wire asynchronous on-chip communications. It is possible to consider switching such communications, but this often involves a complex feedback path to communicate a handshake of each bit of data, or is limited by the number of switching elements that the separate wires can pass through before the difference in path delays for each wire and each gate within the switch becomes too large.

Consider normal serial data in a synchronous system. As explained above, either the clock is considered global, or the clock is routed alongside the data wire. At each switching node the potential misalignment between the data dn the clock increases and eventually becomes too large. The normal procedure is to limit the impact of switching by either limiting the clock frequency or by limiting the "size" (the number of cascaded switch elements) of the switch. The most common solution to this problem is to "retime" the signal at each switch step. Retiming involves capturing the data in a flip-flop and passing the output of that flip-flop, along with the clock, onto the next switch step. Thus one clock cycle of latency is added for each switch step. This is expensive, both in terms of latency and in terms of the area and power consumption of the flip-flop. Thus, the integrity of the data is corrected by resynchronizing with each clock.

SUMMARY

The present disclosure provides, for example, the ability for pulsed serial data to pass through each routing block without resynchronization, a severe impact on latency, silicon area, power costs, or any knowledge of the pulse width encoding.

In one embodiment, the present disclosure provides a method for routing signals. The method includes supplying an information signal to an input of a routing block having multiple outputs. The information signal includes a first edge and a second edge on a single line. The first and second edges are separated by a time period which represents information conveyed by the signal. One of the first and second edges provides timing information. The method further includes controlling the routing block to select one of said multiple outputs and transferring the signal to said selected one of said multiple outputs.

In another embodiment, the present disclosure provides a routing block for routing an input signal. The routing block includes an input adapted to receive on a single line an information signal comprising a first edge and a second edge. The first and second edges are separated by a time period which represents information conveyed by the signal. One of the first and second edges provides timing information. The routing block also includes a plurality of outputs and a circuit to receive a control signal for controlling the routing block to select one of said multiple outputs. The routing block further includes switching circuitry adapted to transfer the signal from said input to said selected one of said multiple outputs.

In still another embodiment, the present disclosure provides an integrated circuit. The integrated circuit includes an apparatus for encoding data and timing information onto a single line. The apparatus includes a first circuit to assert a first edge on the single line to encode said timing information. The apparatus further includes a second circuit to assert a second edge on the single line at a selectable time period after said first edge. The selectable time period represents the data. The apparatus also includes a routing block to route an input signal of the integrated circuit.

Other technical features may be readily apparent to one skilled in the art from the following Figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
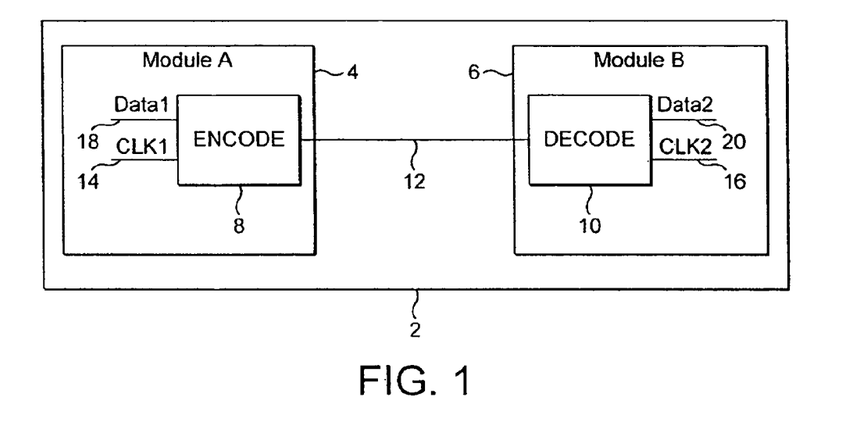
FIG. 1 is circuitry for communication between two modules on an integrated circuit in which embodiments of the present disclosure can be incorporated.

FIG. 1 depicts circuitry in which data is to be transmitted between a module A, labelled 4 in FIG. 1 and module B, labelled 6 in FIG. 1, both modules being on an integrated circuit 2. Although modules A and module B are illustrated as being on the same chip, it will readily be appreciated that the principles discussed in the following can be implemented in a number of different environments, in particular in a situation where the communicating modules are on different ICs. In prior art embodiments, a parallel bus with separate clock distributed to both modules may have been used between modules A and B in order to transmit data and time information. In such systems the clock frequency must be low enough to allow clean synchronous communication across the plurality signal wires comprising the parallel bus. In order to increase the bandwidth (number of bits of useful communication per second) of the system, the number of wires is increased. Alternatively, in typical asynchronous communications, for example in the RS232 serial port, a single wire carries the bit information which is clocked at a specified clock rate. The two clocks, one in the transmitter, and one in the receiver, are independent and asynchronous in both phase and frequency, but are both within the specified tolerance range. This asynchronous arrangement is typically further refined by continuously adjusting, adapting or locking the receive clock to closely match the characteristics of the transmit clock by inference from the edges in the received data. Nonetheless, the two clocks are independent and hence described as asynchronous.

Serial communications links have a number of problems. They have relatively high latency due to resynchronisation requirements at the destination module. Bandwidth is limited due to the tolerance range specified above. In alternative serial connects where a clock is transmitted alongside data, bandwidth will also be limited by tolerances imposed because of timing variations between the signals. Serial links are also costly due the requirement of generating the necessary high speed encoding and sampling clocks. Encode and decode blocks for serial links also require complex logic, especially if analogue techniques are employed.

According to the embodiments such as the embodiment shown in FIG. 1, a single wire 12 is used between modules A and B to transmit data and timing information. In order to achieve this, a data signal DATA1 on line 18 is encoded by an encode block 8 with a clock signal CLK1 received on line 14 before being transmitted on line 12. A decode block 10 decodes the signal on line 12, to retrieve the data signal, now labelled DATA2 on line 20, and the clock signal CLK2 on line

16. According to this embodiment, CLK1 will have the same frequency as CLK2, however the phase relationship between these clocks is indeterminate.

The system of FIG. 1 can be described as GALS (globally asynchronous, locally synchronous) as will now be explained. Module A includes logic (not shown) clocked by CLK1 which generates the data signal DATA1 on line 18, and module B includes logic clocked by CLK2 which receives the data signal DATA2 on line 20. The logic in Modules A and B is synchronous in that it is clocked by CLK1 and CLK2 respectively. However, as CLK1 is not in phase with CLK2, modules A and B can be said to be asynchronous. Therefore, globally the circuit is asynchronous.

A system for encoding data and timing information onto a single connection 12 will now be described with reference to FIGS. 2 to 5. The underlying principle of the system will be described first with reference to FIG. 2A.

Figure 2A:
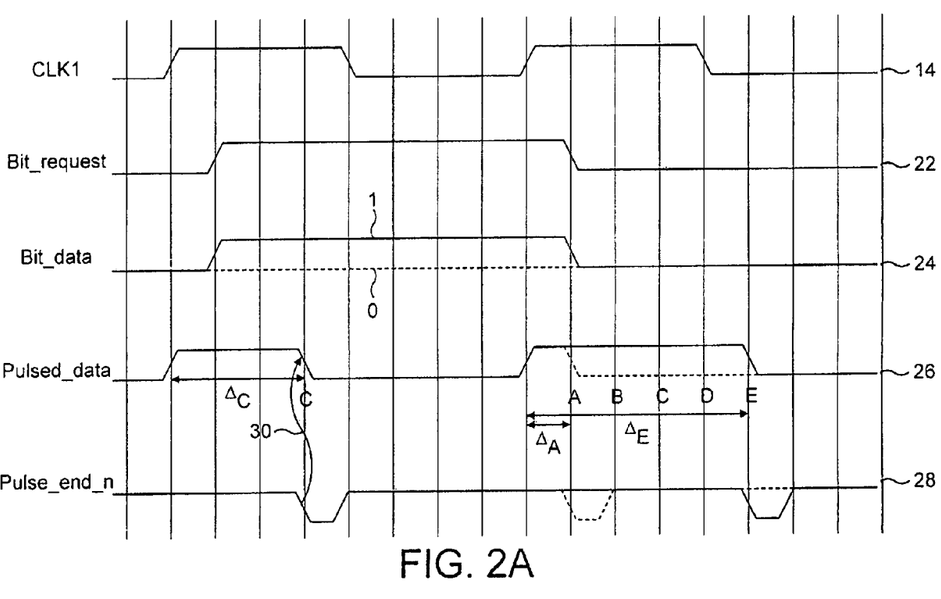
FIG. 2A are data and timing signals encoded according to one example of a pulsed serial link according to one embodiment.
Figure 2B:
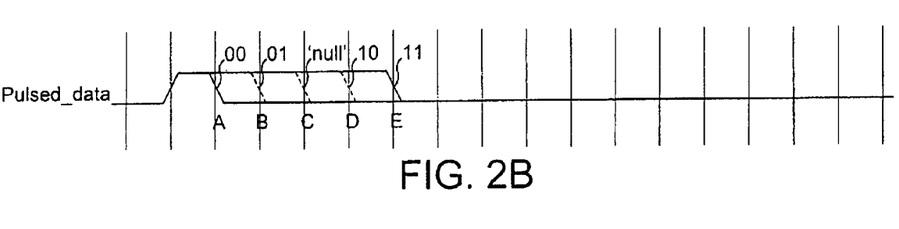
FIG. 2B is the pulsed_data signal in another example of a pulsed serial link according to another embodiment.

FIG. 2A shows timing diagrams for clock signal CLK1 14, a bit_request signal 22, bit_data signal 24, a pulsed_data signal 26, and a pulse_end_n signal 28. The frequency of this clock signal is, for example 100 MHz, however clock frequencies used in other embodiments could be any clock frequency that would work given the particular environment.

Bit_request signal 22 is a common signal used in conjunction with data signals, and when this signal is high, this indicates that the data on bit_data signal 24 is valid.

The bit_data signal 24 indicates the data value whilst bit_request signal 22 is high. The bit_data value transmitted by bit_data signal 24 could be a '1' or '0', represented by a high or low signal: both possibilities are shown in FIG. 2A.

According to embodiments described herein, the clock signal CLK1, bit_request and bit_data signals are all encoded into a single signal. This is shown as pulsed_data signal 26. The rising edges of pulsed_data signal 26 occur immediately following rising edges of clock signal CLK1. Therefore, the pulsed_data signal 26 is still valid as a clock signal for any sequential logic clocked by the rising edge of said pulsed_data signal. When this signal is received by module B, the clock signal may be used not only for allowing the retrieval of the encoded data (discussed later), but also for use as a local clock, after suitable buffering, in module B. The buffering delays the clock to produce CLK2 used by the logic in module B and, thus CLK2 must be treated as a separate clock from that used directly for decoding.

As shown by the example illustration of signal 26, data is encoded into the falling edge of the clock signal which can be transmitted on a single wire (line 12 in FIG. 1). This is achieved by altering the timing of the falling edge depending on the data. In the case that at the time of the first rising edge of CLK1 14, the bit_request was low, this indicates there is no valid data to send. This is indicated by the first falling edge of the pulsed_data signal 26 falling at point C, a predetermined delay $\Delta_C$ from the rising edge.

At the second rising edge of CLK1 14, bit_request signal 22 is high, indicating that there is data on bit_data signal 24. In this case, if the data is a '0', the falling edge will be at time A, a delay $\Delta_A$ from the rising edge, and if the data bit is a '1', the falling edge will be at time E, a delay $\Delta_E$ from the rising edge. In this way data is encoded onto the clock signal. In this embodiment, timing locations B and D (at respective delays $\Delta_B$, $\Delta_D$ from the rising edge) are used when decoding the encoded signal, as will be explained in more detail below.

In this example, the request and one bit of data has been encoded onto three possible positions of the falling edge of the clock signal. Thus effectively 3 input bits (clock, request and one bit of data) have been encoded onto a single wire with only 3 variations per period where normal binary logic would require 8 variations for 3 bits. However, the clock does not represent a full binary bit because it is only the rising edge that is of interest. Also, the combination of request and data does not represent two full binary bits because the data is irrelevant when there is no request.

In alternative arrangements, a single wire with only two or any number more than three possible positions of the falling edge of the clock signal could be used. Such alternative arrangements could be used to encode one, two, three, four or more data bits into each falling edge. Also, as described in more detail below, one or more control functions could be encoded into each falling edge. This would require more, or less, possible timing locations for the falling edge. For example, consider the pulse shown in FIG. 2B, where falling edge location A denotes 00, falling edge location B denotes 01, falling edge location C denotes a null, falling edge location D denotes 10 and falling edge location E denotes 11. It will be apparent when the encoding and decoding circuitry is described below that slight modification to this circuitry would allow a greater number of bits to be transmitted on each falling clock edge. The only limiting factor in the amount of information that can be transmitted is the accuracy of the delay circuitry delaying the falling edges, and the accuracy of the detecting circuitry for detecting the timing of the falling edges in the decode block. However, it is important to note that absolute accuracy of delay elements in encode and decode circuits is not important, only their accuracy in respect to each other.

Finally, the pulse_end_n signal 28 shown in FIG. 2A is a signal that occurs in the encode circuit during the encoding of the data and clock, and this signal will be referred to in relation to the operation of the encoding block.

There are numerous advantages with pulsed serial link described above. This is a genuine single wire connection, with clock, data and data valid encoded on one line. As described below, the encode and decode blocks can be purely digital. Bandwidth is used efficiently. High speed clocks are not required, and nor are analogue techniques. There is also no requirement for an isolated power supply. The logic required for encoding and decoding is minimal, and for higher bandwidth utilisation, the amount of logic scales proportionately. Furthermore, if the clock is stopped during periods when no data is being transferred, the link is power efficient. In the circuit of FIG. 1, when CLK1 is stopped, CLK2 is also stopped and hence all of the logic in module B no longer consumes power.

Figure 3:
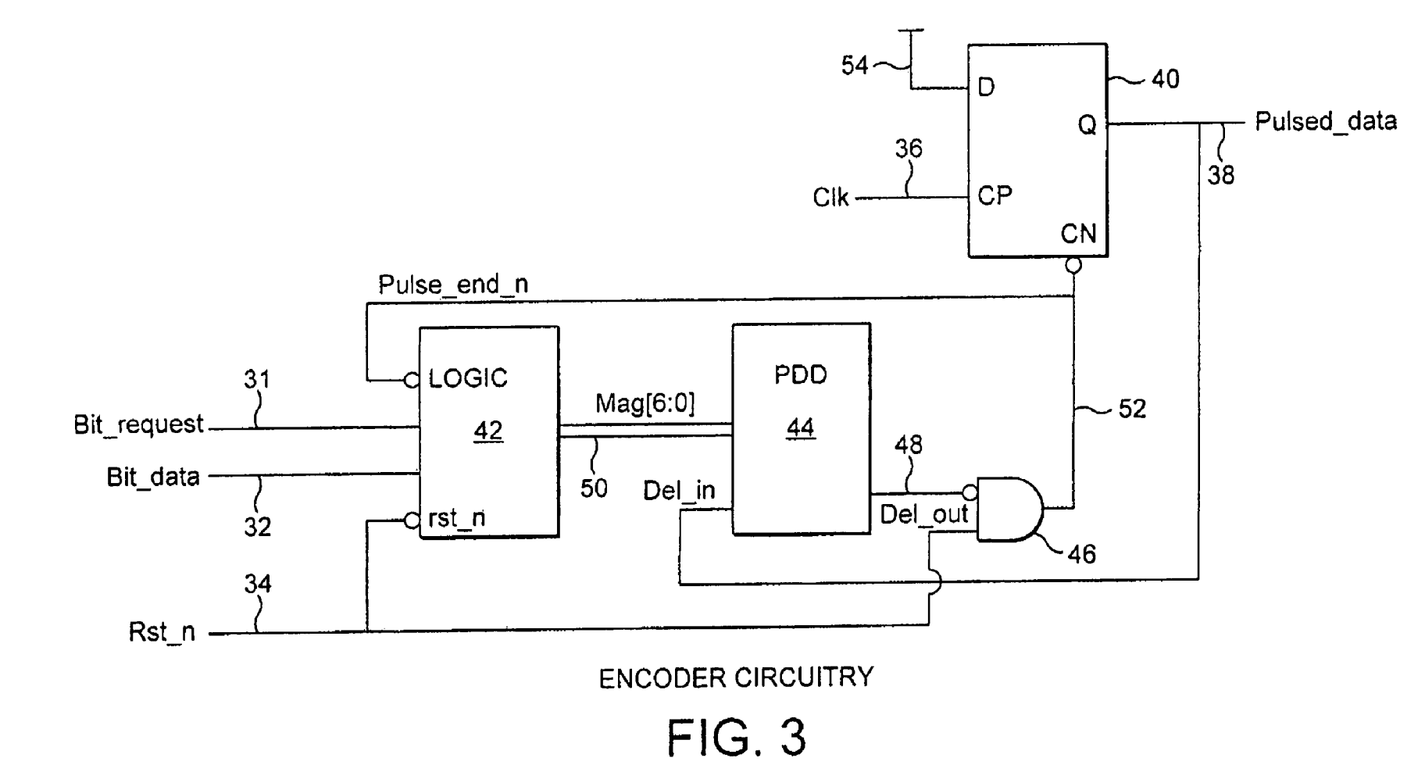
FIG. 3 is encoding circuitry for encoding data in a pulsed serial link according to another embodiment.

FIG. 3 shows encode circuitry according to one embodiment. As shown in FIG. 3, the bit_request signal is provided on line 30, the bit_data signal is provided on line 32, the clock signal is provided on line 36, and a reset signal, rst_n, is provided on line 34. During normal operation of the encoder circuitry, the reset signal, rst_n, on line 34 will be high, allowing the circuit to function normally. The reset signal, rst_n, is asserted low during power up and in other situations to ensure a clean initial state across the system on chip (SoC). However, in alternative embodiments other initialisation techniques could be used which do not require this form of reset signal.

The encoder circuitry comprises a D-type flip-flop 40, logic block 42, a programmable digital delay (PDD) block 44, and AND gate 46. The pulsed_data output signal 26 is provided at the output of flip-flop 40 on line 38. The signals bit_request and bit_data on lines 30 and 32 are connected to inputs of the logic block 42. The reset signal, rst_n, on line 34 and a pulse_end_n signal 52 from the output of the AND gate 46 are also connected to inputs of the logic block 42. Based on the values of bit_request and bit_data, and also the values of the rst_n signal and the pulse_end_n signal, the output of logic block 42 labelled 50 is determined.

In the present embodiment, the output of logic block 42 will be a series of control lines 50, in the form similar to a one hot encoding, which control circuitry in the PDD block 44. One hot encoding is a scheme known to those skilled in the art that allows the complexity of system design to be minimised. There are seven control lines in the embodiment shown in FIG. 3, labelled Mag(0) to Mag(6), and on each line a '0' or a '1' may be asserted, with the only legal combinations being all 0's or a continuous run of 1's across any number of Mag(0), Mag(1) through to Mag(6) respectively. For example, if Mag(4) is asserted, then lines Mag(3) to Mag(0) must also be asserted. This is a requirement of the PDD 44 described in the current embodiment, and if alternative programmable delay lines were used, then different combinations of signal might be possible.

The number of these control lines that are asserted high determines the magnitude of the delay Δ of the programmable digital delay block 44 between its input signal, del_in connected to 38 and its output signal, del_out, connected to 48. Seven control lines are provided is this embodiment, which allow reset plus seven different delay values to be selected. The first such selection, when all control lines 50 are zero, is used when in the defined initial condition for the circuit, which is when rst_n is asserted low. The second such selection, when only mag(0) is '1', is the minimum delay, used to control the width of the low going pulse of pulse_end_n on line 52, as explained in more detail below. Five of the remaining different delay values allow the five delays $\Delta_A$ to $\Delta_E$ to be selected.

The programmable digital delay block 44, which is connected to logic block 42 by connection 50, receives the magnitude control signals Mag(0) to Mag(6), and also receives the pulsed_data signal on line 38 from the flip-flop 40. The PDD 44 determines the timing of the falling edge of the pulsed_data signal on line 38. The inverted output of PDD 44 on line 48 is connected to one input of two input AND gate 46. The second input of AND gate 46 is connected to the reset signal rst_n 34. The output of AND gate 46 on line 52 is connected to a not reset input CN of D-flip flop 40, which causes an asynchronous reset of the flip-flop when line 52 is low, independent of the clock input CP 36. This output on line 52 is also connected to logic block 42.

In alternative embodiments, the magnitude of the delay through the PDD 44 may be controlled by any encoding scheme which is different from the one-hot encoding scheme described above, such as straight binary, gray-code, mixed course plus fine, or any encoding to suit the range and selection of the programmable delays required.

Logic block 42 will output low signals on all of the control lines if the reset signal on line 34 is low, irrespective of values on other inputs. If rst_n is high, and the pulse_end_n signal on line 52 is low, then according to the present embodiment, Mag(0) will be asserted high, and all the other control signals will be low, irrespective of the values of bit_request and bit_data. This will select the smallest time delay from the PDD block 44, used to control the width of the low going pulse of pulse_end_n on line 52.

If rst_n is high, pulse_end_n is high, and bit_request signal 22 on line 30 is low, then this indicates that there is no data, and control lines Mag(4), Mag(3), Mag(2), Mag(1) and Mag(0) will be asserted high by logic block 42, and the rest of this magnitude signal will be controlled to be low. This will result in a delay value being programmed in the PDD block 44 equal to delay $\Delta_C$ shown in FIG. 2A. It should be noted that this delay is calculated from the rising edge of the pulsed_data signal 26.

If on the other hand the bit_request signal on line 30 is high, then the values on the control lines will depend on the data bit to be transmitted. If bit_data signal on line 32 is a '0' (low), control lines Mag(2), Mag(1) and Mag(0) will be asserted high and the rest of the control lines will be low. This would control the PDD block 44 to give a delay equal to AA. If the data bit is a '1' (high), then all of the control lines Mag(6) to Mag(0) will be asserted, giving the greatest possible delay. This would control the PDD block 44 to give a delay equal to $\Delta_E$.

In practice, because the delays through components 40, 42 and 46 in FIG. 3 are significant with respect to the individual delay steps of PDD 44, then the actual width of the pulsed_data high pulse will be different from the programmed delay through PDD 44. However, since the delay steps of the programmable delays in the decoder match the delays steps of PDD 44 in the encoder to an acceptable tolerance, then any implementation offset can be compensated at the design stage in either encoder or decoder.

Operation of the encoder circuitry of FIG. 3 will now be described with reference to the timing diagrams in FIG. 2A. As explained above, flip-flop 40 provides the pulsed_data output on line 38. The D input to this D type flip-flop is connected to line 54, which is connected high (logic '1'). Therefore whenever the clock input on line 36 goes high, output Q of the D flip-flop will go high shortly afterwards. However, the reset input of the D type flip-flop 40 is connected to line 52. This reset input is inverted, and therefore whenever the pulse_end_n signal on line 52 goes low, the output of the flip-flop will be reset to 0. The timing of this reset determines the timing of the falling edge of the pulsed_data signal 38.

As shown in FIG. 2A, shortly after the first rising edge of CLK1, the pulsed_data signal goes high. This is because the high input at the D input of flip flop 42 is clocked by CLK1, and output at the Q output of the flip flop. Note that the pulse_end_n signal on line 52 is high, and therefore the D flip flop is not being reset.

The rising edge of the pulsed_data signal will arrive at the PDD block 44, and the time delay provided by this block will be determined by the values of the control signals Mag(6) to Mag(0). These signals are provided by logic block 42, and as the reset signal, rst_n, is high and the pulse_end_n signal is high, but the bit_request signal 30 is currently low, magnitude control lines Mag(4) to Mag (0) will be asserted high, and the other lines will be low. This means that the output of a programmable digital delay block 44 will rise at time C, which is a certain delay after the rising edge of the pulsed_data signal, controlled by the programmable digital delay circuitry.

The rising edge of the delay block output on line 48 will cause the pulse_end_n signal on line 52 to go low, as the signal at the inverted input of AND gate 46 will now be high. The falling edge of the pulse_end_n signal 28 in FIG. 2, on line 52 will in turn cause the flip-flop 40 to reset, causing the pulsed_data signal fall to 0 at time C, very shortly after the delayed rising edge at the PDD output. This is shown in FIG. 2A by arrow 30.

The falling edge of pulsed_data signal on line 38 will also arrive at the input to the programmable digital delay. This time, the control signals provided by logic block 42 will be different. This is because the pulse_end_n signal is now low, and in this situation, as explained above, only Mag(0) is asserted high, and the remaining control signals are asserted low. This provides the minimum delay step through PDD 44.

Therefore, following this minimum delay after the falling edge of pulsed_data, the pulse_end_n signal will return to high, releasing the asynchronous inverted clear input to flip-flop 40 again. However, it will not be until the next rising edge of clock signal 36 that the activation of the flip-flop 40 is noticed at the output. Note that a minimum delay is used for the low width of pulse_end_n 52, but if implementation analysis revealed any timing hazard, then this minimum delay could be increased by one or more steps.

On the next rising edge of CLK1, once again the pulsed_data output on line 38 will go high. This rising edge will arrive at the programmable digital delay block 44. This time reset, rst_n, and pulse_end_n are both high, and bit_request is also high. Therefore the control signals 50 will be determined by the bit_data signal on line 32.

As mentioned above, if the data bit were a '0', then control signals Mag(2) to mag(0) would be asserted, and if the bit_data value were a '1', then control signals Mag (6) to Mag(0) would be asserted. In the case of a '0' bit, the pulse_end_n signal will fall at time A. This would then reset the D flip-flop 40 and cause the pulsed_data output 38 to drop shortly after point A. The falling edge of the pulse_end_n signal on line 52 would cause logic 42 to then assert only control signal Mag (0), providing the minimum delay until the pulse_end_n signal rises again.

Alternatively, if the data bit on line 32 were a '1', then the pulse_end_n signal would fall at time E, causing the D flip-flop 40 to reset and pulsed_data signal 38 to fall. Again, the falling edge of the pulse_end_n signal on line 52 will cause logic 42 to assert only the control signal Mag(0), meaning that the pulse_end_n signal will rise again after the minimum delay step.

PDD 44 is used to control the high width of pulsed_data via bit_request 30 and bit_data 32, and is also used to control the low width of pulse_end_n 52. It is important that this minimum width of pulse_end_n low is controlled in order to avoid asynchronous timing problems which could be induced if pulse_end_n 52 was allowed to merely to glitch low. A minimum delay value is used here, rather than no delay at all, as if implementation analysis reveals any timing hazard, the minimum delay may be increased by one or more steps.

Another subtlety of this design is the property that pulse_end_n input to 42 causes the designated minimum delay code to be set on 50. The design of the PDD 44 is such that all 1's which may be residual in the PDD, as a consequence of a long pulsed_data high pulse width to encode a requested bit_data value of 1, are cleared by the selection of this minimum delay. This means that the next rising clock edge on 36 can occur shortly after the minimum delay following the latest falling edge of pulsed_data. If this were not the case then the next clock edge could not safely occur until after pulsed_data had been low for the maximum delay.

The pulsed_data signal on line 38 will be transmitted via line 12 to module B, where it will be decoded by a decode block 10. Decoding of the pulsed_data signal will now be described with reference to FIGS. 4 and 5.

Figure 5:
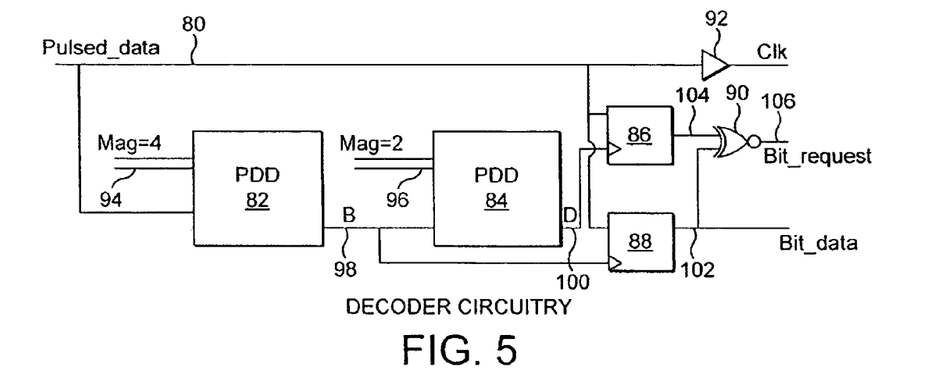
FIG. 5 is decoding circuitry for decoding data and timing signals from the encoded signal of FIG. 3.

FIG. 5 shows decoder circuitry. Two programmable digital delay blocks are provided labelled 82 and 84. The output of the programmable digital delay block 82 is connected to the clock input of a first D flip-flop 88. The output of the second programmable digital delay block 84 is connected to the clock input of a second D flip-flop 86. The pulsed_data signal is input on line 80 and provided to the input of the PDD block 82. The output of PDD 82 is provided to the input of the PDD 84. Alternative arrangements might implement a single digital delay, which does not need to be programmable, but provides output taps equivalent to magnitudes 4 and 6 respectively.

The output of D flip-flop 88 provides the bit_data signal. The output of the flip-flop 86 on line 104 is connected to one input of a two input exclusive NOR gate 90. The second input of the exclusive NOR gate 90 is connected to the output of flip-flop 88. The output of exclusive NOR gate 90 on line 106 provides the bit_request signal.

The clock is also retrieved from the pulsed_data signal having been passed through a Buffer 92. As described above, the clock is preferably used to clock logic in the destination module. A clock tree would be used to distribute the clock to this logic, and Buffer 92 is provided to drive the clock tree loading. A greater number of buffers may be required for this purpose. It should be noted that there may be a significant delay, possibly more than one period of the clock, in propagating the clock through such a clock tree.

Figure 4:
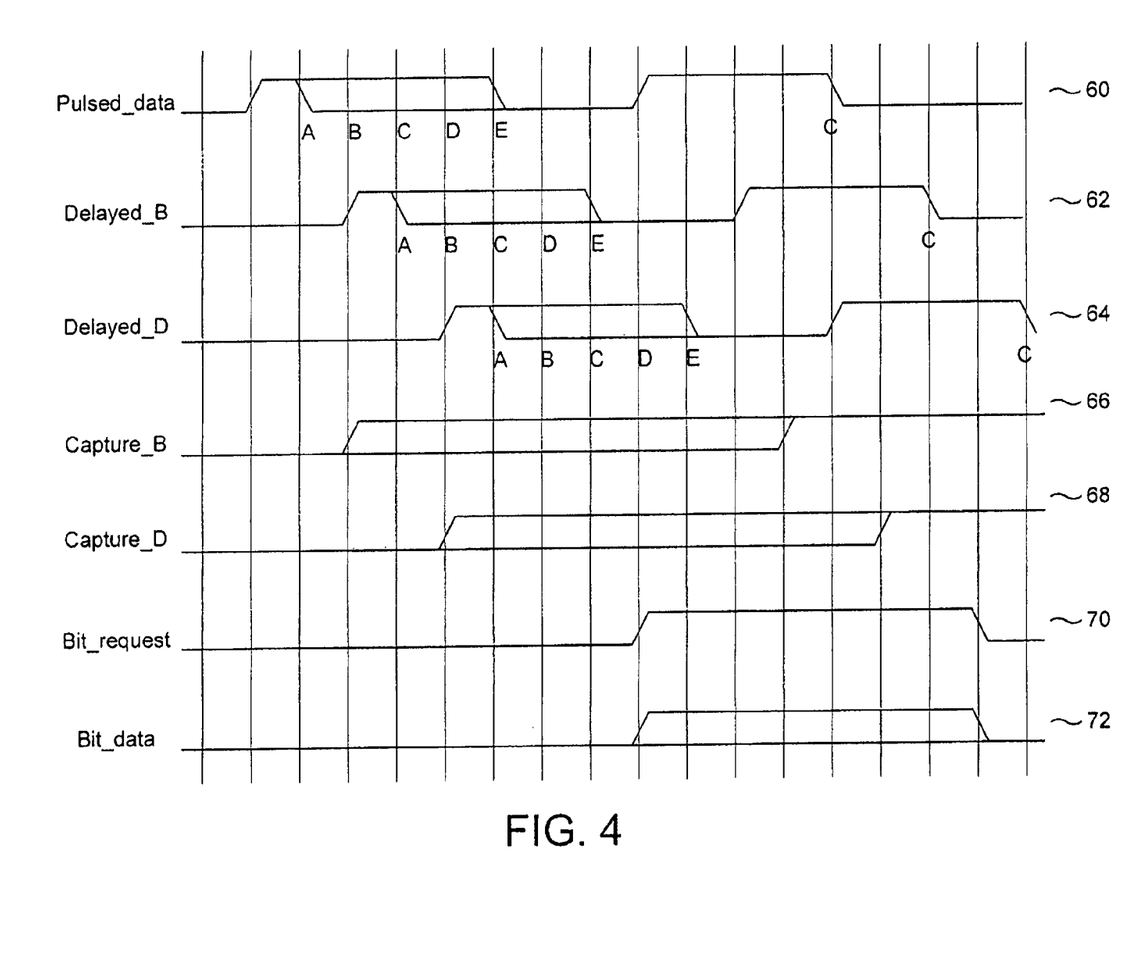
FIG. 4 is data and timing signals recovered from the encoded signal of FIG. 3.

The programmable digital delay blocks 82 and 84 provide measuring gauges in order to determine the timing of the pulsed_data signal. The output of a first delay block 82 is at time B. Signal 62 shown in FIG. 4 illustrates the signal on line 98 output of PDD block 82. As shown by signal 62, the rising edge of this signal is aligned with position B of the pulsed_data signal. In order to provide this delay, control lines Mag (6) to Mag(0) are used to control delay elements in the PDD blocks 82 and 84 in a similar fashion to the previous example. However, in the PDD 82 and 84, the values on the control lines to each PDD 82 and 84 will usually be fixed so that the delay selection provided by these blocks remains constant.

In order to give a delay at time B, control signals Mag(3) to Mag(0) will be asserted high, and the remaining control signal asserted low. The output of the PDD block 82, delayed to time B, is provided to the PDD block 84. PDD block 84 outputs the pulsed_data signal after a delay to time D. Control signals Mag (1) to Mag (0) are asserted on lines 96 at the input to PDD 84 in order for PDD 84 to have the required delay.

As explained above, the pulsed_data signal, as shown in FIGS. 2 and 4, has three possible positions of the falling edge at times A, C, or E. The pulsed_data signal will arrive on line 80 of the decode block shown in FIG. 5. Consider sampling the pulsed_data at positions B and D respectively. If the values sampled at B and D are both low, then the falling edge must be at position A. If the values sampled at B and D are high and low respectively, then the falling edge must be at position C. If the values sampled at B and D are both high, then the falling edge must be at position E.

According to the encoder, described above, position A represents a valid data bit 0, position C represents no valid data, and position E represents a valid data bit 1. It can be seen that for valid data, sampled values at B and D are either both high, or both low; and if both values at B and D are high or low, the data value can be extracted by looking at either sample. In the embodiment shown in FIG. 5 the sampled value at B is used to extract the data bit. When there is no valid data, then the values sampled at B and D are different, being high and low respectively; hence the data valid signal bit_request can be extracted by the logical exclusive NOR function. Alternatives allow such logic extraction to be automatically optimised and could implement any boolean equivalent. Again, alternatives of the sampling points and boolean logic would allow for alternative numbers of falling edge positions, numbers of bits encoded and alternative coding schemes.

In the preferred arrangement, the sampling mechanism to capture the value at position B is to clock the value of the pulsed_data 80 at the D input of flip-flop 88, using a clock edge at position B. The clock edge is simply created by delaying the pulsed_data 80 by passing it through PDD 82 with appropriate settings on its magnitude inputs 94. The output of flip-flop 88 on line 102 is the value sampled at position B. This signal, is shown in FIG. 4 labelled Capture_B 66. Likewise, the sampling mechanism to capture the value at position D is to clock the value of the pulsed_data 80 at the D input of flip-flop 86, using a clock edge at position D. This clock edge is created by further delaying the delayed_B 98 by passing it through PDD 84 with appropriate settings on its magnitude inputs 96. The output of flip-flop 86 on line 104 is the value sampled at position D. This signal is shown in FIG. 4 labelled capture_D 68. The extracted bit_request 106 is the output of the exclusive-NOR gate 90, with inputs capture_B on line 102 and capture_D on line 104. The capture_B output from flip-flop 88 on line 102 is the extracted bit_data signal, shown as signal 72 in FIG. 4.

As described previously, the programmable delay lines in the encode and decode blocks are preferably programmable digital delay blocks. A programmable digital delay blocks will now be described with reference to FIG. 6.

Figure 6:
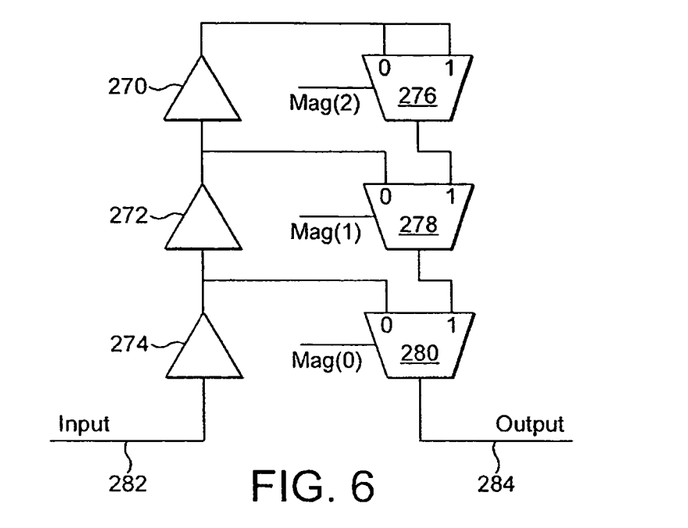
FIG. 6 is one possible embodiment of a programmable digital delay line.

FIG. 6 shows a programmable digital delay line in which the input to the delay line on line 282 is connected to a number of delay elements 270, 272, 274 which are connected in series. Three multiplexers are provided, which are labelled 276, 278, 280. Each multiplexer has two inputs, labelled '0' and '1'. If the control signal to a multiplexer is a '0', the '0' input will be selected. If the control signal is a '1', the '1' input will be selected.

The '0' input of each of the multiplexers 270 to 274 is connected to a different point on the delay line. For example, the '0' input to multiplexer 280 is connected to the output of delay element 274. In the case of the last multiplexer in the line, which in this case is multiplexer 276, both of its two inputs are connected to the output from the last delay element in the line, delay element 270. The second input to each of the other multiplexers in the circuit is connected to the output of the previous multiplexer. For example, the '1' input to multiplexer 278 is connected to the output of multiplexer 276. The '1' input to multiplexer 280 is connected to the output of multiplexer 278. In this circuit, the output of multiplexer 280 on line 284 provides the output of the delay line.

Operation of this delay line circuit is as follows. Each of the multiplexers 276 to 280 has a control input, and these are labelled Mag(2) to Mag(0) respectively. If multiplexer 280 is controlled to output the signal received at its '0' input, the signal of the output of delay element 274 will be selected for output. In this case the overall delay at the output 284 would be equal to the delay of delay element 274, and the delay added by multiplexer 180. If however, multiplexer 280 is controlled to output the input received at its '1' input, and multiplexer 278 is controlled to output the input received at its '0' input, the signal at the output of delay element 272 will be connected via multiplexers 278 and 280 to the output 284. In this case, the total delay to the input signal present at the output on line 284 would be equal to the delay added by delay elements 274 and 272 and the delays added by the multiplexers 278 and 280. This will always be greater than the delay when only one delay element is selected. Thus in this circuit, monotonicity is always maintained, as the more delay elements that are selected, the greater the delay at the output.

It should be obvious to those skilled in the art that although only three delay elements and three multiplexers have been shown in this circuit for clarity, in practise the number of delay elements and multiplexers could be any required number, for example 500 or more. These would be provided in the series, connected in a similar fashion to delay 272 and multiplexer 278.

The minimum selectable delay in the circuit of FIG. 6 will be when only delay element 274 and multiplexer 280 are selected. If delay element 274 is a very small delay, then this smallest delay can be a lot smaller than smallest delay selected by the multiplexer tree.

Another advantage of the circuit layout in FIG. 6 is that the delay line may be positioned relatively freely on the chip in whatever layout is required by the chip designer. The delay elements and multiplexers could be arranged in one long line, or alternatively they could be arranged in a zigzag. In either case, the performance of the delay line would not be affected.

Figure 7A:
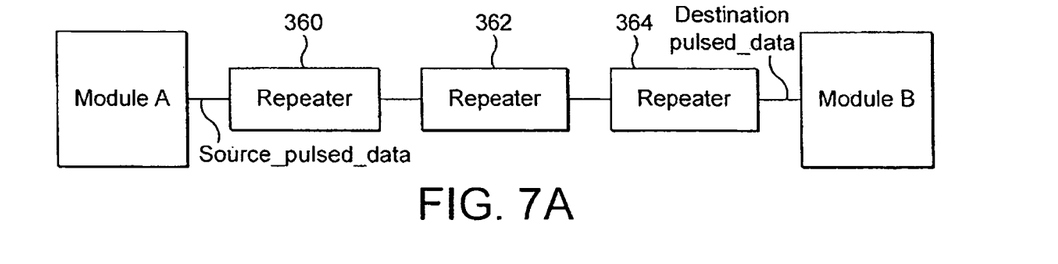
FIG. 7A is a series of repeaters used for communication between two modules.
Figure 7B:
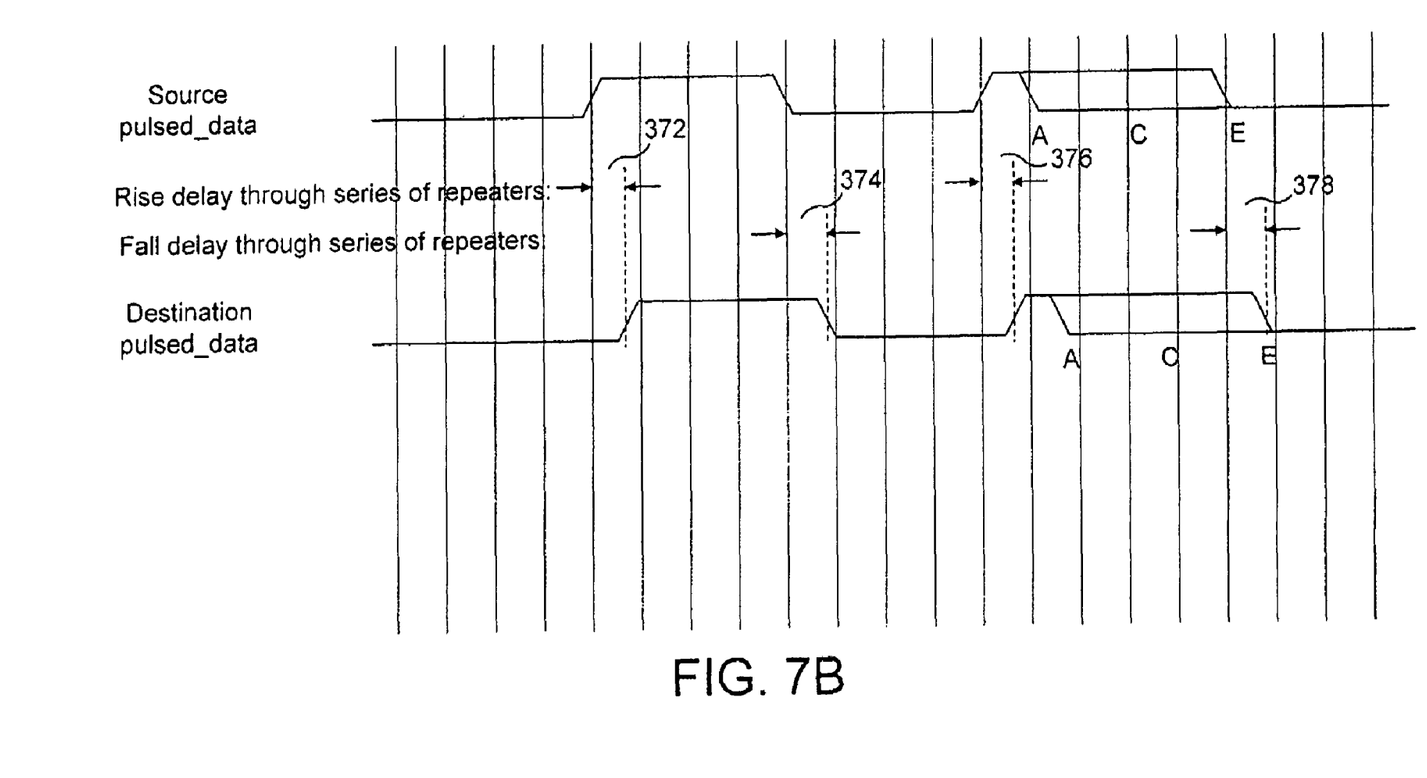
FIG. 7B is timing of signals in FIG. 6 according to one example.

Reference will now be made to FIGS. 7A and 7B. FIG. 7A shows the use of repeaters between two modules A and B on a chip. As with the circuit of FIG. 1, these modules could alternatively be on separate chips. If the track between modules A and B is relatively long, then high drive strengths will be required in order to overcome capacitance in the line. Lines with high drive strengths risk being cross-talk aggressors, meaning that they interfere with other lines on the chip. The solution is generally to limit the maximum length on any one track.

A problem with limiting track lengths is that the maximum length is small in comparison to the distances between logic blocks on an SoC, or between SoCs. This can be solved by placing "repeaters" along the length of the connection between its endpoints, such that the distance between the repeaters is less than the maximum length. As shown in FIG. 7A in this circuit three such repeaters, labelled 360 to 364, are necessary between modules A and B.

For a parallel bus, significant timing margins need to be provided to allow for the overall delay through the required number of repeaters, and the maximum variation in delays between all paths. The clock frequency is generally reduced to allow for these delays. Alternatively, a clock can be routed alongside the data so that the overall delay is eliminated, however, the variations in delay across the many tracks will still need to be taken into account. Furthermore, in this situation it would also be necessary to resynchronise the data, which impacts performance due to the latency overhead of resynchronising data.

Serial communication links overcome some of the above problems, however there will still be variations in delay between a clock signal and the data line that have to be dealt with. By implementing a serial connection as described above, using pulsed_data on a Pulsed Serial Link, a number of these problems are overcome, as will now be explained with reference to FIG. 7B.

FIG. 7B shows examples of a source pulsed_data signal as it leaves module A, and a destination pulsed_data signal that arrives at module B. The rising and falling edges of the pulsed_data signal will be delayed through the three repeaters and the line, but not necessarily by equal amounts. Delays 372 and 376 shown in FIG. 7b are the delays to the rising edges. Delays 374 and 378 shown are the delays to the falling edges.

Importantly, the absolute delay to the pulsed_data signal will not affect the ability to decode the signal, as it is only the timing between the positive edge to the falling edge at A, C or D that contains the data. The absolute delay for a given edge will be affected by the following PVT (process, voltage, temperature) parameters, which, as indicated, will be largely irrelevant when the modules are on the same silicon. Process (P) variation will be slight because the link and blocks are on the same silicon. Voltage (V) will be constant across the whole of the chip, apart from locally induced noise effects.

Finally, temperature (T) will be constant because the all of the silicon is at the same temperature.

The main contributor to variations in delay (for a given edge) is locally induced noise effects. These are small compared to PVT variations. Such variations do need to be taken into account in the overall timing analysis of a pulsed serial link. However, it should be noted that the increase in noise margin does not increase linearly with the number of buffers (statistical analysis required).

Therefore there is no limit on the physical distance between communicating blocks, as there is no constraint in the number of repeaters that may be used and the absolute delay that may be added. Furthermore, the clock signal does not have to be limited to meet the timing constraints described above, and therefore the bandwidth is not compromised by the overall distance of the link.

According to embodiments of the pulse data circuitry described above, the difference in delay between opposite polarity edges (the difference between 372 and 374) is largely irrelevant. However, it is important that the delay from each positive edge to the next positive edge is tightly controlled, and also, independently, the delay between each negative edge and the next is tightly controlled.

The design of logic to implement a repeater would be straightforward for one skilled in the art. It does not require a clock (or reset) to be connected to the repeater. The embedded data is not decoded and then reconstituted, so the repeater design is independent of any particular coding scheme. There are no special power supply or other analogue requirements, and repeaters can be instanced by automated tools.

Depending on available chip area for encode and decode blocks, and the required bandwidth, different numbers of selectable pulse widths can be used to encode the data onto the serial connection. For lower bandwidth requirements, then two selectable pulse widths can be used to carry simple binary data. The bandwidth efficiency is essentially one bit of data per clock period, minus any serial protocol overheads. The encoding and decoding of the pulsed serial link with only two selectable pulse widths can be achieved with only a handful of gates.

For higher bandwidths, then a large number of pulse widths can be used. Additional steps need to be taken to ensure that the resolution between successive pulse widths can be both accurately encoded and accurately decoded. This can be achieved with the addition of calibration techniques, as will now be described.

As explained above, when the pulse serial link is used, the absolute delay between the transmitting module and the receive module is not important. This is because the information in the pulse is carried in the timing between the rising edge and the falling edge of the pulse, and not in absolute delay. However, if there are inaccuracies in the programmable digital delay lines of the transmit or receive modules, incorrect data could be determined from the received pulse width. Furthermore, if delay in the line between the modules affects rising edges differently from falling edges, the data may be corrupted. In order to avoid these problems, it is necessary that the receive module is calibrated such that the timing of the cut-off points are adjusted to be correct according to the timing of the received data.

Signals in the pulsed serial format described can be transmitted from one logic block to another, and the received signal can be decoded into a standard parallel format using the decoder described above in relation to FIG. 5, before logic operations are performed on the signal by the receive logic. In order to transmit signals between blocks, routers or switches can be provided.

Figure 8:
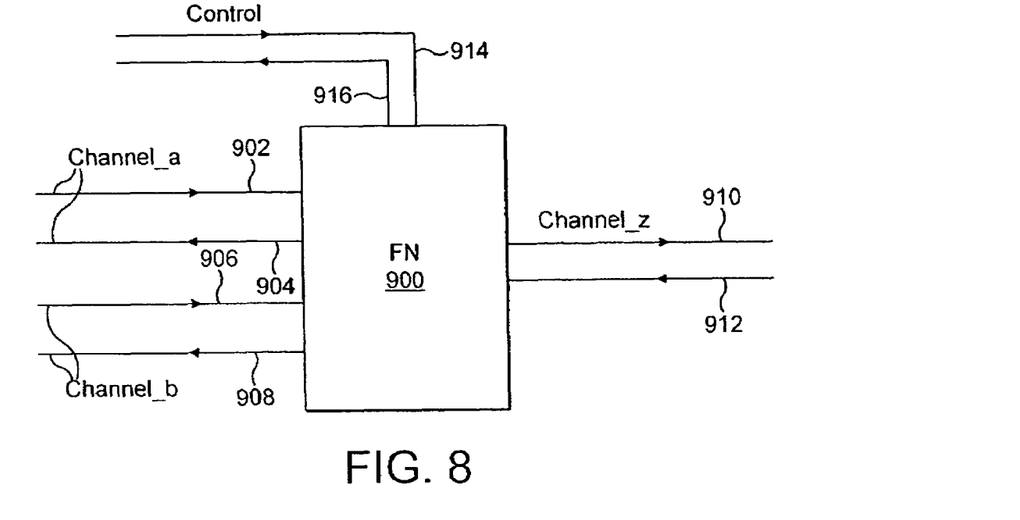
FIG. 8 is a simple switch according to an embodiment of the present disclosure.
Figure 9:
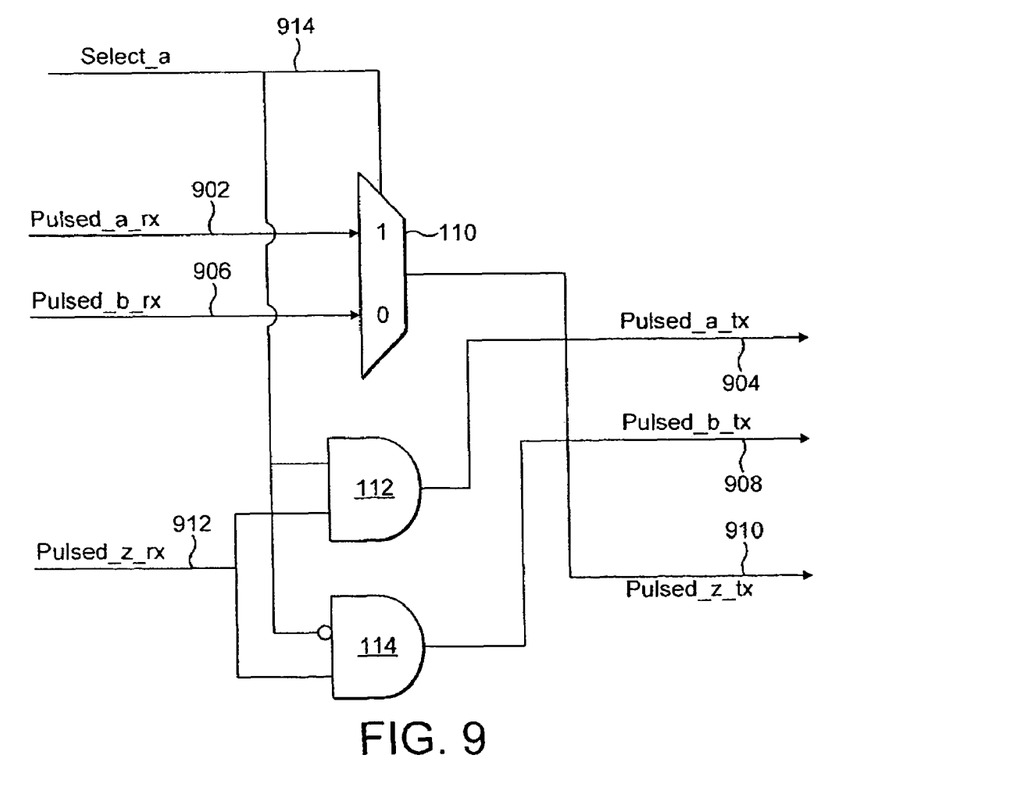
FIG. 9 is the simple switch in more detail.

FIG. 8 illustrates a routing block or switch which has data inputs and outputs for receiving and outputting pulsed serial data signals. Routing block 900 controls communications between three bi-directional channels a, b and z, labelled channel_a, channel_b and channel_z respectively. Each channel comprises an input path for receiving data signals, and an output path for outputting data signals from the block. Input paths of channels a, b and z are labelled 902, 906 and 910 respectively. The output paths of channels a, b and z are labelled 904, 908, and 910 respectively. A control path is also provided for controlling functions of the routing block 109. The control path can be unidirectional or bidirectional. FIG. 9 shows a bidirectional path with the input line being labelled 914 and the output 916. The return path 916 can be useful in a switching application. If it is deemed inappropriate to switch mid-stream (by detecting non-idle, or via any other mechanism) then the control input can be used to "request" a change from channel_a to channel_b (or vice versa) and the return path 916 can be used to indicate when a gap in the stream has been detected and that the switch over has actually occurred, i.e. confirm or "acknowledge".

The routing block of FIG. 8 operates as a switch, connecting a selected one of channels a and b to channel z. The selection is determined by the control signal on line 914, however, if a suitable protocol is implemented, the selection could be performed by encoding control signals onto one of the input channels, on lines 902, 906 or 912. This would require only certain pulses of the pulsed signal to be decoded in order to extract the control information such that data pulses could be correctly routed.

The switch is bi-directional, that is signals can be transmitted through the switch in either direction. Signals on one of channels a or b can be routed via the switch to channel z, and signals on channel z may be routed to one of channels a and b.

FIG. 9 shows the circuitry of the switch of FIG. 8 in more detail. Lines which are the same as those shown in FIG. 8 have been given the same reference numerals as those in FIG. 8. As shown, a two-input multiplexer 110 is provided, with one input connected to the input line 902 of channel a, and the second input connected to the input line 906 of channel b. The output of the multiplexer is connected to the output line 910 of channel z. The multiplexer is controlled by the input control line 914. This circuitry enables one of channels a and b to be connected to channel z. Two two-input AND gates 112 and 114 are also provided, with one input of each being connected to the input line 912 of channel z. The second input of AND gate 112 is connected to control line 914. The second input of AND gate 114 is inverted, and also connected to control line 914. This circuitry allows a signal received on channel z to be routed to either channel a or channel b.

Figure 10:
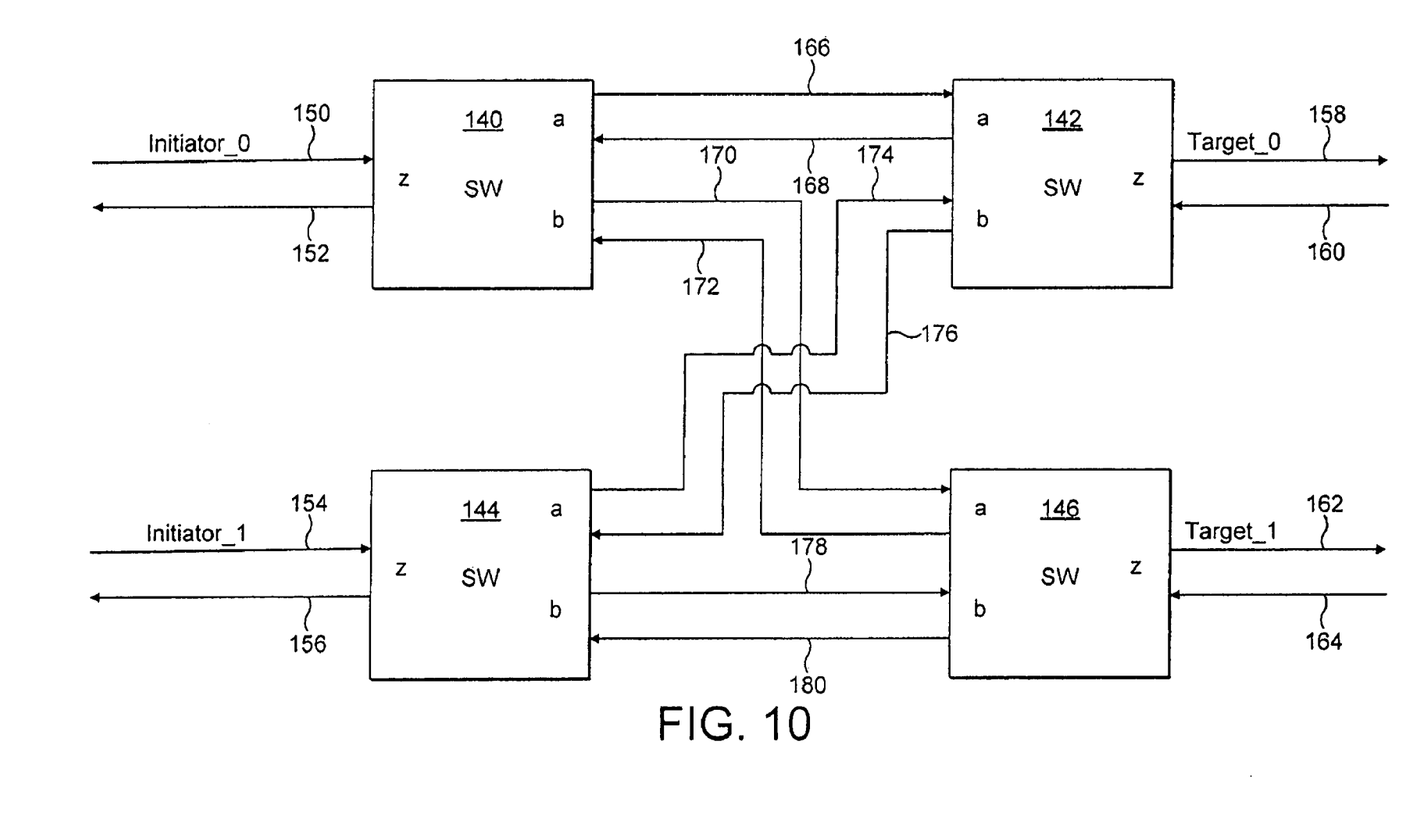
FIG. 10 is a cross-bar circuit configuration according to one embodiment of the present disclosure.

FIG. 10 shows a cross-bar configuration comprising four of the switches shown in FIG. 9 connected together. The switches are labelled 140, 142, 144 and 146, and each comprises three inputs from channels a, b and z, and three outputs to channels a, b and z. The z channel of each switch is connected to respective circuit blocks (not shown in FIG. 10), the blocks being labelled initiator_0, initiator_1, target_0 and target_1. The z-channel inputs on lines 150, 154, 160 and 164 from respective circuit blocks are connected to the z-channel inputs of respective switches 140, 144, 142 and 146. Likewise the z-channel outputs from each switch on lines 152, 156, 158 and 162 are connected to the respective initiator and target blocks.

The input and output lines of the a and b channels of each switch are connected as follows. Channel a of switch 140 is connected to channel a of switch 142. Channel b of switch 140 is connected to channel a of switch 146. Channel b of switch 142 is connected to channel a of switch 144. Channel b of switch 144 is connected to channel b of switch 146.

Due to the configuration of the circuitry in FIG. 10, both initiator circuit blocks initiator_0 and initiator_1 are able to communicate bi-directionally with the target circuit blocks target_0 or target_1, and no storage elements are required. For example, initiator_0 is able to communicate bi-directionally with target_1 when switch 140 is controlled to connect channel z to channel b and switch 146 is controlled to connect channel a to channel z. Similarly, initiator_1 is able to communicate bi-directionally with target_1 when switch 144 is controlled to connect channel z to channel b and switch 146 is controlled to connect channel b to channel z.

The cross bar configuration used with the pulsed serial signal has the advantage that due to the nature of the pulsed signal, the link between circuit blocks will be immune to path delay, and therefore retiming stages are not required.

The control signals to each of the switches in FIG. 10 have not been shown, however each switch is controlled in same way as described above with reference to FIG. 9. The three control alternatives include single conventional control wire, pulsed-serial control signals (with optional return path) or control information encoded on the data inputs. There are design trade-offs for each of these alternatives. Alternatively, as mention above, the switches are controlled by control signals received via their data inputs. This has the advantage that fewer connections would be required between the initiator and target circuit blocks.

Figure 11:
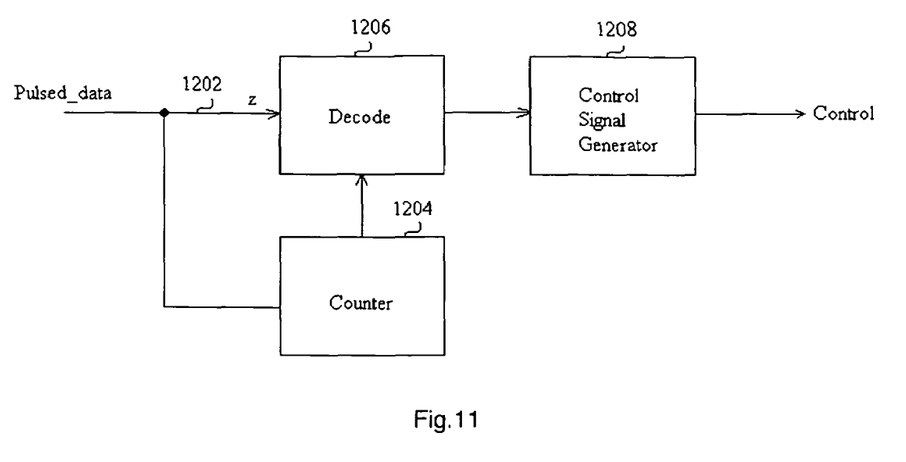
FIG. 11 shows circuitry for decoding control signals encoded in the data path according to one embodiment of the present invention.

FIG. 11 shows circuitry for decoding control signals encoded in the data path. As shown, the pulsed data signal is received on line 1202. Either of the two initiator blocks initiator_0 and initiator_1 may control the switches, and therefore this circuitry is provided in both switches 140 and 144. In the present embodiment, control signals are generated to control all of the switches in the cross bar. In alternative embodiments, the control signal only controls the switch currently receiving the pulsed_signal, and each switch contains the decode circuitry for decoding the control data associated with its connections.

The pulsed_data signal is received on channel z, and provided to a decode block 1206 and a counter block 1204. Counter block 1204 is used for determining which pulsed_data pulses should be decoded to generate control signals. This will depend on the particular protocol used. For example, data blocks are transmitted in groups of 16 pulses, with the first pulse of the sixteen pulses containing the control information for controlling the switches. In this case, the counter will count, and enable the decode circuitry on for the first pulse, and the seventeenth pulse, and every sixteenth pulse thereafter.

Decode block 1206 comprises circuitry for decoding the pulsed signal that is similar and operates in a similar way to the circuitry shown in FIG. 5. Depending on the number of bits of information transmitted in each pulse, and the number of switches to be controlled by the control information, the decoded control data will comprise one or more bits, which are outputted serially to a control signal generator block 1208. The control information may be in a form that can be used to directly control the circuitry in the switches, or it could be an address of the target block. In the latter case, the control signal generator block generates the required control signals based on the address provided by the control signal. The control signal generator also converts the control signal into a parallel signal that is then provided to the appropriate switches in the cross bar.

There are a number of advantages to the present disclosure. First, a pulsed serial data can now pass through each routing block without any resynchronization, without any severe latency impact, without area and power costs and without any knowledge of the pulse width encoding. The routing block does not need to know how many widths are used to encode data. In fact, the routing block could quite happily mix/switch a two width stream on one side with a three or four width stream on the other side, either of which containing or not containing embedded encoding for nulls and/or acknowledgements. Also, for practical implementations, there is no limit on the number of routing blocks that can be cascaded. If necessary, because of a very large number of switch steps, because of a high operating frequency or because of a fine tolerance multi-width encoding, calibration in accordance with other known methods may be added.

While reference is made to "an input" it will readily be understood that the routing block can have any number of ports (e.g. channels, connecting points, terminals, modes, etc) on one side and an arbitrary number of ports on a second side, where each port can be bidirectional, comprising two wires, and can simultaneously and independently carry input information (clock and data or nulls) on one wire and output information on the other wire. The block can allow the information connection (in either/both directions) between any one port and any other port. In one embodiment the information connection (in either/both directions) is between any one (initiator) port on the left of the block and any one (target) port on the right of the block. A full cross bar can support simultaneous communications between initiator_0 and target_0 at the same time as between initiator_1 and target_1 in one configuration, or alternatively it can support simultaneous communications between initiator_0 and target_1 at the same time as between initiator_1 and target_0 in another configuration.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for routing signals comprising:
   supplying to an input of a routing block having multiple outputs an information signal comprising:
      a first edge; and
      a second edge on a single line, the first and second edges being separated by a time period which represents information conveyed by the information signal, and one of the first and second edges providing timing information;
   controlling the routing block by a circuit to select one of said multiple outputs by supplying a control signal to a control port of the routing block, said control signal including control information encoded by a first edge and a second edge, the first and second edges being separated by a time period which represents said control information; and transferring the information signal to said selected one of said multiple outputs.

2. The method according to claim 1, wherein said timing information comprises a clock signal having consecutive clocking edges spaced by a clock period, wherein each first edge asserted on the single line corresponds to a clocking edge of said clock signal.

3. The method according to claim 1, wherein said information includes a null.

4. The method according to claim 1, further comprising interconnecting a plurality of routing blocks in a crossbar configuration.

5. A routing block for routing an input signal comprising:
an input adapted to receive on a single line an information signal comprising a first edge and a second edge, the first and second edges being separated by a time period which represents information conveyed by the information signal, and one of the first and second edges providing timing information;
a plurality of outputs;
a circuit to receive a control signal for controlling the routing block to select one of said multiple outputs, said control signal comprising control information encoded by a first edge and a second edge, the first and second edges being separated by a time period which represents said control information; and
switching circuitry adapted to transfer the signal from said input to said selected one of said multiple outputs.

6. The routing block according to claim 5, wherein said timing information comprises a clock signal having consecutive clocking edges spaced by a clock period, wherein each first edge asserted on the single line corresponds to a clocking edge of said clock signal.

7. The routing block according to claim 5, wherein said information includes a null.

8. A crossbar switch comprising a plurality of routing blocks in accordance with claim 5 interconnected in a crossbar configuration.

9. An integrated circuit comprising an apparatus for encoding data and timing information onto a single line, the apparatus comprising:
a first circuit to assert a first edge on the single line to encode said timing information;
a second circuit to assert a second edge on the single line at a selectable time period after said first edge, said selectable time period representing said data;
a clock source providing a clock signal that provides said timing information; and
a routing block to route an input signal of the integrated circuit, said routing block comprising:
an input adapted to receive on a single line an information signal including a first edge and a second edge, the first and second edges being separated by a time period which represents information conveyed by the information signal, and one of the first and second edges providing timing information;
a plurality of outputs;
a circuit to receive a control signal for controlling the routing block to select one of said multiple outputs, said control signal including control information encoded by a first edge and a second edge, the first and second edges being separated a time period which represents said control information; and
switching circuitry adapted to transfer the information signal from said input to said selected one of said multiple outputs.

10. The integrated circuit according to claim 9, wherein said timing information comprises a clock signal having consecutive clocking edges spaced by a clock period, wherein each first edge asserted on the single line corresponds to a clocking edge of said clock signal.

11. The integrated circuit according to claim 10, further comprising a clock source to provide said clock signal.

12. The integrated circuit according to claim 9, wherein said information includes a null.

13. A crossbar switch comprising a plurality of routing blocks in accordance with claim 9, interconnected in a crossbar configuration.

14. A method for routing signals, comprising:
supplying to an input of a routing block having multiple outputs an information signal that includes a first edge and a second edge on a single line, the first and second edges being separated by a time period which represents information conveyed by the information signal, and one of the first and second edges providing timing information;
controlling the routing block by a circuit to select one of said multiple outputs by decoding information conveyed by the information signal as control information; and
transferring the information signal to said selected of said multiple outputs.

15. The method according to claim 14, wherein said timing information comprises a clock signal having consecutive clocking edges spaced by a clock period, wherein each first edge asserted on the single line corresponds to a clocking edge of said clock signal.

16. The method according to claim 14, wherein said information includes a null.

17. The method according to claim 14, further comprising interconnecting a plurality of routing blocks in a crossbar configuration.

18. A routing block for routing an input signal comprising:
an input adapted to receive on a single line an information signal comprising a first edge and a second edge, the first and second edges being separated by a time period which represents information conveyed by the information signal, and one of the first and second edges providing timing information;
a plurality of outputs;
a decoder to decode control information from the information signal for controlling the routing block, said control information configured to control the routing block to select one of said multiple outputs; and
switching circuitry adapted to transfer the information signal from said input to said selected one of said multiple outputs.

19. The routing block according to claim 18, wherein said timing information comprises a clock signal having consecutive clocking edges spaced by a clock period, wherein each first edge asserted on the single line corresponds to a clocking edge of said clock signal.

20. The routing block according to claim 18, wherein said information includes a null.

21. A crossbar switch comprising a plurality of routing blocks in accordance with claim 18 interconnected in a crossbar configuration.

22. An integrated circuit comprising an apparatus for encoding data and timing information onto a single line, the apparatus comprising:

a first circuit to assert a first edge on the single line to encode said timing information;

a second circuit to assert a second edge on the single line at a selectable time period after said first edge, said selectable time period representing said data;

a clock source providing a clock signal providing said timing information; and a routing block to route an input signal of the integrated circuit, said routing block comprising:

an input adapted to receive on a single line an information signal comprising a first edge and a second edge, the first and second edges being separated by a time period which represents information conveyed by the information signal, and one of the first and second edges providing timing information;

a plurality of outputs;

a decoder to decode control information from the information signal for controlling the routing block, said control information configured to control the routing block to select one of said multiple outputs; and switching circuitry adapted to transfer the information signal from said input to said selected one of said multiple outputs.

23. The integrated circuit according to claim 22, wherein said clock signal has consecutive clocking edges spaced by a clock period, wherein each first edge asserted on the single line corresponds to a clocking edge of said clock signal.

24. The integrated circuit according to claim 22, wherein said information includes a null.

25. A crossbar switch comprising a plurality of routing blocks in accordance with claim 22, interconnected in a crossbar configuration.

* * * * *